United States Patent
Sun

(10) Patent No.: US 10,771,017 B2
(45) Date of Patent: Sep. 8, 2020

(54) AMPLIFIER CIRCUIT WITH LOW MALFUNCTION RATE

(71) Applicant: Elite Semiconductor Memory Technology Inc., Hsinchu (TW)

(72) Inventor: Shao-Ming Sun, Hsinchu County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 5 days.

(21) Appl. No.: 16/242,011

(22) Filed: Jan. 8, 2019

(65) Prior Publication Data

US 2020/0220501 A1 Jul. 9, 2020

(51) Int. Cl.
*H03F 1/26* (2006.01)
*H03F 3/217* (2006.01)
*H03F 3/45* (2006.01)

(52) U.S. Cl.
CPC .............. *H03F 1/26* (2013.01); *H03F 3/217* (2013.01); *H03F 3/45479* (2013.01)

(58) Field of Classification Search
USPC .................. 330/149, 9, 251, 207 A
See application file for complete search history.

(56) References Cited

U.S. PATENT DOCUMENTS

| | | | | |
|---|---|---|---|---|
| 6,448,851 B1 * | 9/2002 | McIntosh | ................ | H03F 1/301 327/307 |
| 8,139,792 B2 * | 3/2012 | Magrath | ................ | H03F 1/305 330/10 |

* cited by examiner

*Primary Examiner* — Hieu P Nguyen
(74) *Attorney, Agent, or Firm* — Winston Hsu

(57) ABSTRACT

An amplifier circuit with novel design is provided. The amplifier circuit includes an input stage, a resistor, an output stage, an intermediate stage and a gm circuit. The input stage is coupled to a first supply voltage, and is arranged to receive an input voltage and a feedback current. The resistor is coupled between the input voltage and the input stage. The output stage is coupled to a second supply voltage, and is arranged to provide an output voltage for driving a load. The intermediate stage is coupled between the input stage and the output stage, and includes a level shifter. The gm circuit is coupled to the input stage, and is arranged to compare the input voltage with a common mode voltage, and thereby generates a compensate current for the input stage.

9 Claims, 4 Drawing Sheets

AMPLIFIER CIRCUIT WITH LOW MALFUNCTION RATE

BACKGROUND OF THE INVENTION

1. Field of the Invention

The present invention relates to class D power amplifiers, and more particularly, to offset mitigate the negative effect resulted from the high voltage output stage of the class D power amplifier.

2. Description of the Prior Art

Referring to FIG. 1, which illustrates a related art class D power amplifier circuit 100. The amplifier circuit 100 comprises an input stage 10, an intermediate stage 20 and an output stage 30. The input stage 10 has a first amplifier X1 coupled to a supply voltage VDD. The intermediate stage 20 has a second amplifier X2 and a level shifter 25 (also marked with LEVEL SHIFT). The output stage 30 is coupled to another supply voltage PVDD, which is generally higher than VDD. Under the wide power supply range of the supply voltage PVDD (e.g. 4V~26V), the voltage at the node N1 would be varied with the supply voltage. This can be considered as a great disadvantage. Further, malfunctions would also occur in the amplifier circuit 100 when the difference between the supply voltages PVDD and VDD is too large. In other words, the high voltage at the node N1 might cause undesired malfunctions.

Hence, there is a need for novel design to eliminate the above issues from amplifier circuits.

SUMMARY OF THE INVENTION

The present invention utilizes a simple transconductance circuit (hereinafter briefed as "gm" circuit) to mitigate the influence of a high voltage output by extracting the current flowing from the high voltage output.

According to an embodiment of the present invention, an amplifier circuit with novel design is provided. The amplifier circuit comprises an input stage, a resistor, an output stage, an intermediate stage and a gm circuit. The input stage is coupled to a first supply voltage, and is arranged to receive an input voltage and a feedback current. The resistor is coupled between the input voltage and the input stage. The output stage is coupled to a second supply voltage, and is arranged to provide an output voltage for driving a load. The intermediate stage is coupled between the input stage and the output stage, and comprises a level shifter. The gm circuit is coupled to the input stage, and is arranged to compare the input voltage with a common mode voltage, and thereby generates a compensate current for the input stage.

With the above design, the present invention is capable of eliminating the aforementioned problems without introducing a side effect. More specifically, the present invention may effectively solve the problems without the need of sensing PVDD (i.e. the second supply voltage), and thus the circuit can be manufactured with a small chip area. For example, the present invention does not need an extra circuit for sensing the difference voltage between PVDD and VDD.

These and other objectives of the present invention will no doubt become obvious to those of ordinary skill in the art after reading the following detailed description of the preferred embodiment that is illustrated in the various figures and drawings.

DETAILED DESCRIPTION

Some phrases in the present specification and claims refer to specific elements; however, please note that the manufacturer might use different terms to refer to the same elements. Further, in the present specification and claims, the term "comprising" is open type and should not be viewed as the term "consists of." The term "electrically coupled" can refer to either direct connection or indirect connection between elements. Thus, if the specification describes that a first device is electrically coupled to a second device, the first device can be directly connected to the second device, or indirectly connected to the second device through other devices or means.

Figure 1:
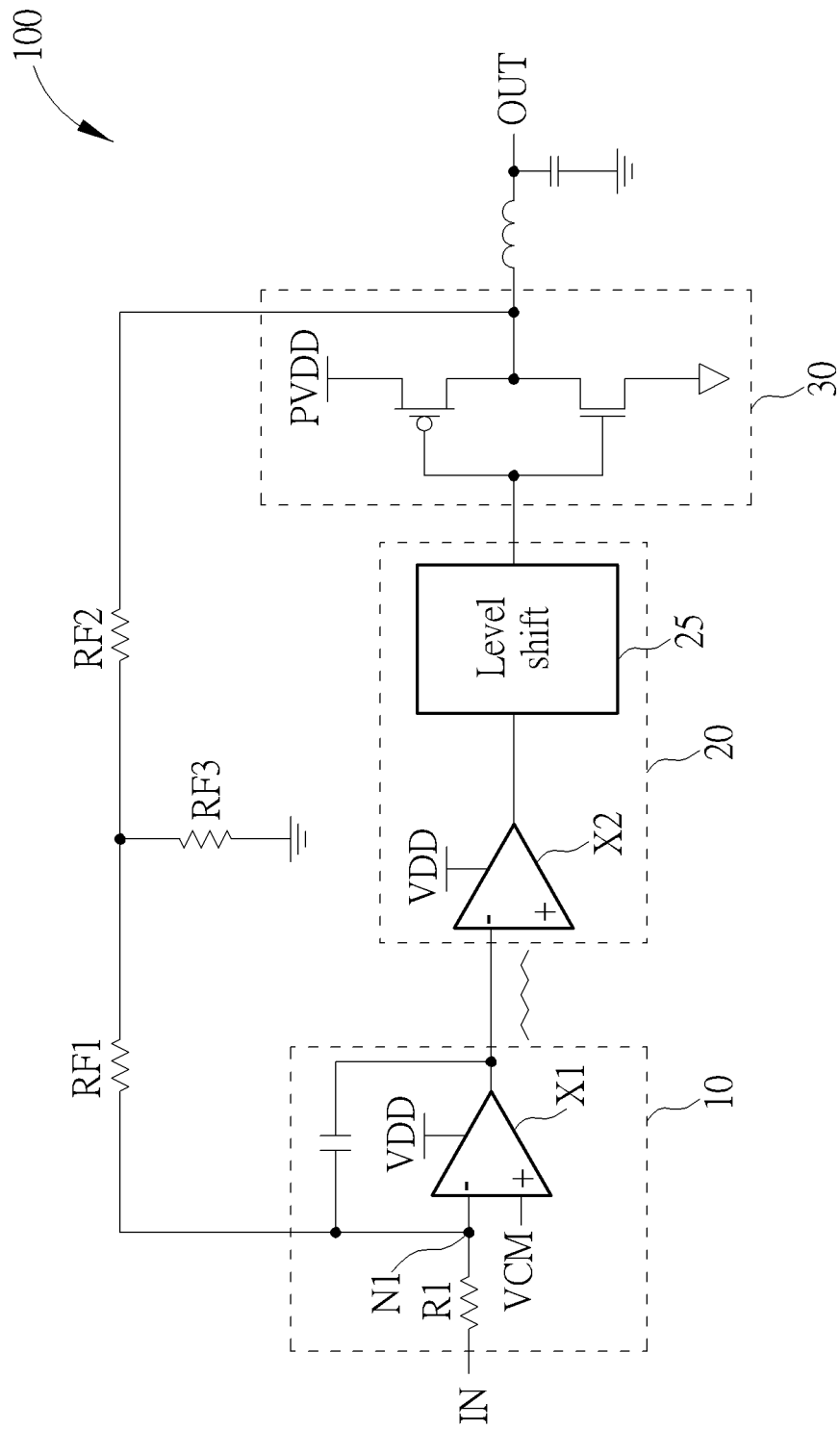
FIG. 1 is a diagram illustrating a related art amplifier circuit.
Figure 2:
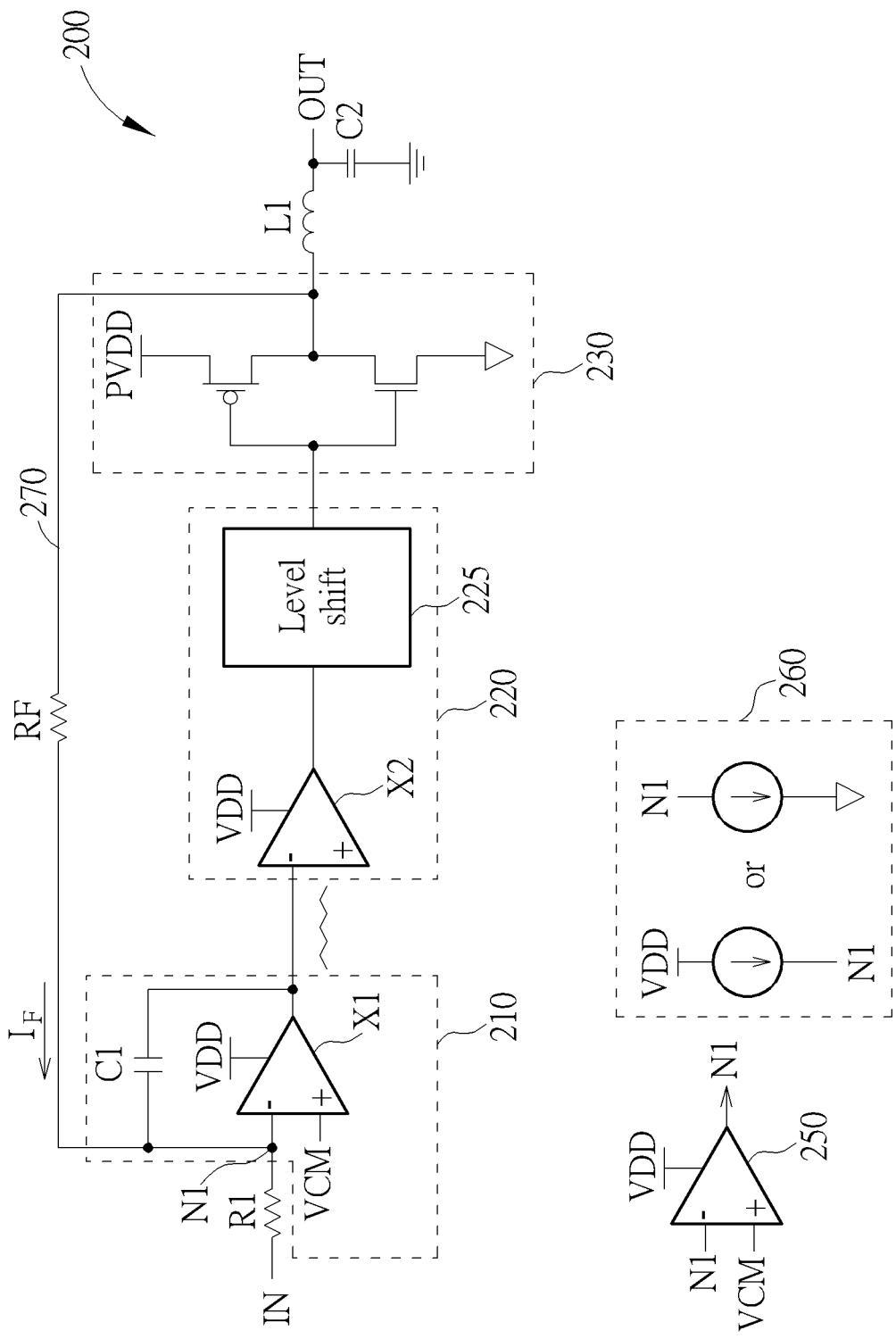
FIG. 2 is a diagram illustrating an amplifier circuit according to an embodiment of the present invention.

Please refer to FIG. 2, which illustrates an amplifier circuit 200 according to an embodiment of the present invention. The amplifier circuit 200 comprises an input stage 210, a resistor R1, an intermediate stage 220 and an output stage 230. The input stage 210 is coupled to a first supply voltage VDD, and is arranged to receive a first voltage and a feedback current $I_F$ at a first node N1. The input stage 210 comprises an amplifier X1 and a capacitor C1. The amplifier X1 has a positive input end, a negative input end and an output end, wherein the negative input is arranged to receive the first voltage at the node N1, the positive input end is arranged to receive a common mode voltage VCM, and the output end is coupled to the negative input end, with the capacitor C1 coupled therebetween. The common mode voltage VCM is preferably equal to VDD/2, but the present invention is not limited thereto. The magnitude of the common mode voltage VCM may be determined according to actual design requirements.

The resistor R1 is coupled between an input voltage IN and the input stage 210. The output stage 230 is coupled to a second supply voltage PVDD which is different from the first supply voltage VDD, and is arranged to provide an output voltage for driving a load L1. The intermediate stage 220 is coupled between the input stage 210 and the output stage 230, and comprises an amplifier X2 and a level shifter 225.

The transconductance (gm) circuit 250 is coupled to the input stage 210, and is arranged to compare the first voltage at the node N1 with the common mode voltage VCM, and thereby generates a compensate current for the input stage 210. The gm circuit 250 is functioned as a common-mode feedback loop for tracking the voltage difference between the first voltage at the node N1 and the common mode voltage VCM, and the voltage difference is converted to the compensate current. The compensate current then adds to the first node N1 to compensate the voltage difference between the first voltage and the common mode voltage VCM. In this manner, the gm circuit 250 can stabilize the first voltage at the common mode voltage VCM.

Further, when the second supply voltage PVDD is higher than the first supply voltage VDD, the gm circuit 250 may be functioned as a bias current source for sinking the compensate current at the input stage 210 (as shown in the right part of the sub-diagram 260). The current flowing through the bias current source should be large enough to stabilize the first voltage at VCM, and is preferably larger than a predetermined current level. The predetermined current level $I_{PRE}$ maybe calculated based on the following equation, but the present invention is not limited thereto.

$$I_{PRE} = \frac{PVDD - VDD}{RF}$$

"RF" (presented in italics) represents the resistance of the feedback resistor RF. The feedback resistor RF is coupled between the input stage 210 and the output stage 230. As long as the current flowing from the supply voltage PVDD to the node N1 can be properly drained, the predetermined current level $I_{PRE}$ may also be determined in a different way.

In another example, when the second supply voltage PVDD is lower than the first supply voltage VDD, the gm circuit may be functioned as another bias current source (as shown in the left part of the sub-diagram 260) for sourcing the compensate current from the supply voltage VDD to the input stage 210. The current flowing through the bias current source should be large enough to stabilize the first voltage at VCM, and should be preferably larger than the predetermined current level $I_{PRE}$.

With the above design, the present invention is capable of eliminating the aforementioned problems without introducing a side effect. More specifically, the present invention may effectively solve the problems without the need of sensing PVDD (i.e. the second supply voltage), and thus the entire amplifier circuit can be manufactured with a small chip area. For example, the present invention does not need an extra circuit for sensing the difference voltage between PVDD and VDD.

Figure 3:
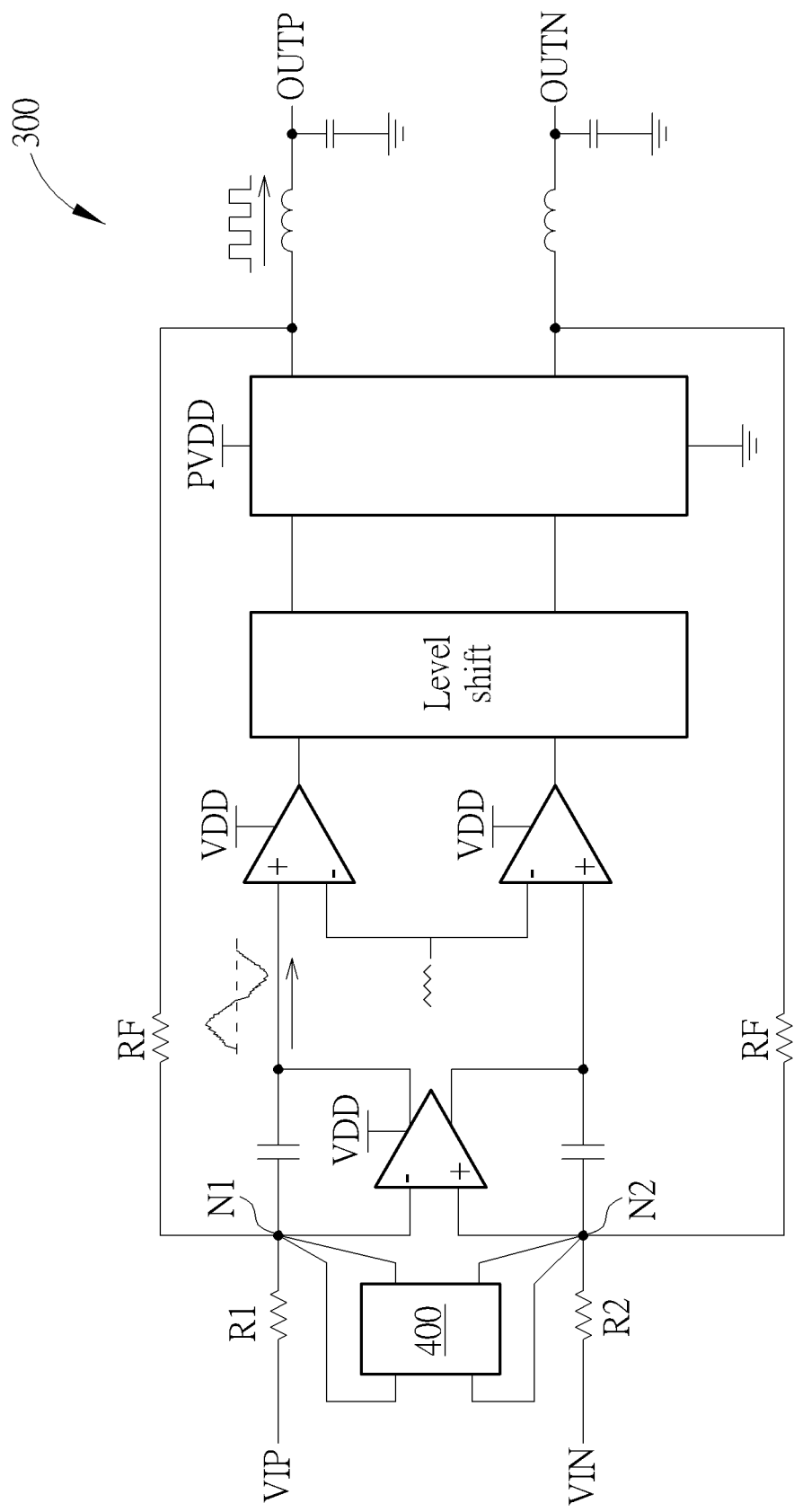
FIG. 3 is a diagram illustrating a differential amplifier circuit according to an embodiment of the present invention.
Figure 4:
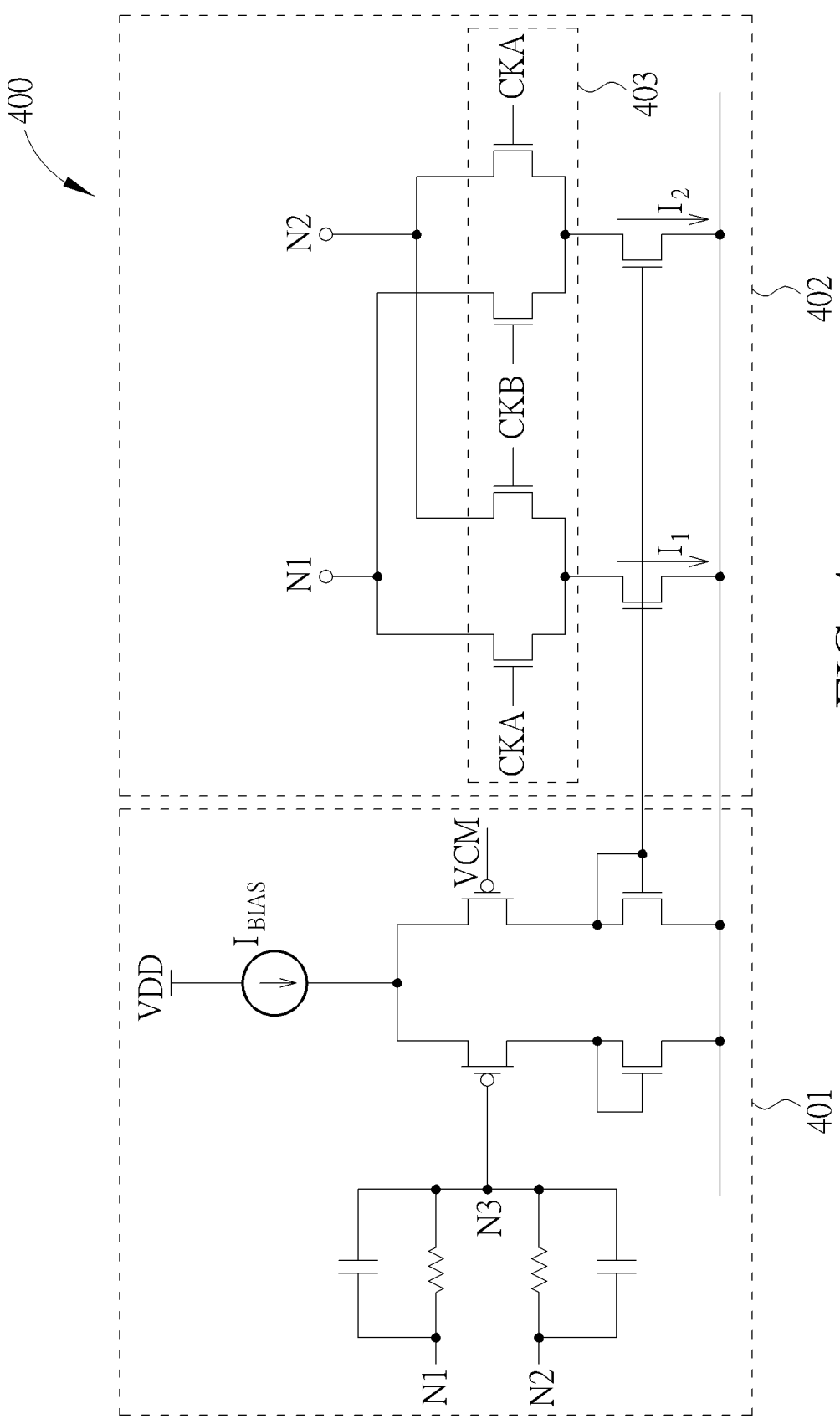
FIG. 4 is a diagram illustrating an exemplary design of the gm circuit applicable to the differential amplifier circuit shown in FIG. 3.

Please refer to FIG. 3, which illustrates a differential amplifier circuit 300 according to an embodiment of the present invention. In this embodiment, the amplifier circuit 200 previously described in FIG. 2 is now modified in a differential fashion. Since one skilled in the art is readily to understand how to modify a non-differential amplifier circuit into a differential amplifier circuit, the detailed descriptions of the differential amplifier circuit 300 is omitted here for brevity. Since the problem existing in related arts (the voltage difference between VDD and PVDD) can be eliminated via the above configuration, the input stage may output a sawtooth sine wave (as shown in the figure) to the intermediate stage. An exemplary design of the gm circuit 400 is shown in FIG. 4. The gm circuit 400 has a differential input stage 401 and a differential output stage 402. Referring to FIG. 4, the two differential input voltages at nodes N1 and N2 are averaged and compared with the common mode voltage VCM. The voltage difference between the voltage at a node N3 and the common mode voltage VCM is converted to the compensate currents I1 and I2. The compensate currents I1 and I2 add to the nodes N1 and N2 to compensate the voltage difference between the voltages at node N1, N2, and the common mode voltage VCM. Therefore, the gm circuit 400 can stabilize the voltage at the node N3 at the common mode voltage VCM.

Referring to FIG. 4, the differential output stage 402 further comprises a chopper stage 403 controlled by control logics CKA and CKB. The levels of the control logics CKA and CKB are configured in opposite. For example, when the control logic CKA is 0, the control logic CKB will be 1; and when the control logic CKA changes from 0 to 1, the control logic CKB will be changed from 1 to 0. The control logics CKA and CKB are used for the output stage of the gm circuit 400 so as to eliminate offset and 1/f noise.

The present invention provides a simple, efficient way to avoid possible malfunctions due to the high voltage difference between the input stage and output stage of an amplifier circuit, without the need for further requiring a circuit for sensing the voltage at the output stage (i.e. PVDD).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
   an input stage, coupled to a first supply voltage, the input stage arranged to receive a first voltage at a first node;
   a first resistor, coupled between an input voltage and the input stage;
   an output stage, coupled to a second supply voltage which is different from the first supply voltage, the output stage arranged to provide an output voltage for driving a load;
   a second resistor, coupled between the input stage and the output stage;
   an intermediate stage, coupled between the input stage and the output stage, the intermediate stage comprising a level shifter; and
   a transconductance (gm) circuit, coupled to the input stage rather than the intermediate stage, the gm circuit arranged to compare the first voltage with a common mode voltage, and thereby generates a compensate current to the first node.

2. The amplifier circuit of claim 1, wherein when the second supply voltage is higher than the first supply voltage, the gm circuit is functioned as a bias current source for sinking the compensate current at the first node.

3. The amplifier circuit of claim 2, wherein the current flowing through the bias current source is larger than a predetermined current level, and the predetermined current level is determined by the equation:

$$"I_{PRE} = \frac{PVDD - VDD}{RF}",$$

wherein $I_{PRE}$ represents the predetermined current level, PVDD represents the second supply voltage, VDD represents the first supply voltage, and RF represents the resistance of the second resistor.

4. The amplifier circuit of claim 1, wherein when the second supply voltage is lower than the first supply voltage, the gm circuit is functioned as a bias current source for sourcing the compensate current at the first node.

5. The amplifier circuit of claim 4, wherein the current flowing through the bias current source is larger than a predetermined current level, and the predetermined current level is determined by the equation:

$$I_{PRE} = \frac{PVDD - VDD}{RF},$$

wherein $I_{PRE}$ represents the predetermined current level, PVDD represents the second supply voltage, VDD represents the first supply voltage, and RF represents the resistance of the second resistor.

6. The amplifier circuit of claim 1, wherein the input stage further comprises an amplifier having a positive input end, a negative input end and an output end; the negative input end of the amplifier is coupled to the first node; the positive input end of the amplifier is coupled to the common mode voltage; and the output end of the amplifier is coupled to the negative input end of the amplifier.

7. The amplifier circuit of claim 6, wherein the input stage further comprises a capacitor coupled between the negative input end and the output end.

8. The amplifier circuit of claim 1, wherein the common mode voltage (VCM) is equal to VDD/2.

9. The amplifier circuit of claim 1, wherein the input stage further comprises an amplifier having two input ends, and the gm circuit has a differential input stage and a differential output stage; and the differential input stage and the differential output stage of the gm circuit are coupled to the two input ends of the amplifier.

\* \* \* \* \*